United States Patent [19]
Gusinov

[11] Patent Number: 5,872,811
[45] Date of Patent: Feb. 16, 1999

[54] DIFFERENTIAL LINE DRIVER

[75] Inventor: Alex Gusinov, Lexington, Mass.

[73] Assignee: Analog Devices, Inc., Norwood, Mass.

[21] Appl. No.: 677,661

[22] Filed: Jul. 8, 1996

[51] Int. Cl.$^6$ .................. H04B 3/00; H03K 19/0175; H03K 19/086; H01P 5/12

[52] U.S. Cl. .................. 375/257; 375/258; 326/89; 326/90; 326/126; 333/109; 333/116

[58] Field of Search .................. 375/257, 258; 326/89, 90, 126, 127; 333/109, 116

[56] References Cited

U.S. PATENT DOCUMENTS

| | | | |
|---|---|---|---|
| 4,760,282 | 7/1988 | Kuo et al. | 326/90 |
| 4,791,314 | 12/1988 | Kuo et al. | 326/90 |
| 5,049,763 | 9/1991 | Rogers | 326/33 |
| 5,051,609 | 9/1991 | Smith | 327/109 |
| 5,065,050 | 11/1991 | Fernandez | 326/89 |
| 5,321,575 | 6/1994 | Shilo | 361/56 |
| 5,457,406 | 10/1995 | Takada et al. | 326/90 |
| 5,506,521 | 4/1996 | Collins | 326/126 |

*Primary Examiner*—Chi H. Pham
*Assistant Examiner*—Khai Tran
*Attorney, Agent, or Firm*—Fish & Richardson P.C.

[57] ABSTRACT

A differential line driver having a pair of transistors arranged as a differential pair for driving a transmission line with a differential logic output signal produced in accordance with a differential logic input signal fed to the base electrodes of the pair of transistors. The differential line driver includes circuitry for suppressing EMI emissions generated by common mode voltage switching transients produced at the collector electrodes of the pair of transistors in response to changes in the differential logic input signal. The common mode voltage switching transient suppression circuitry includes a pair of additional transistors. The differential logic input signal is fed to base electrodes of the additional transistors, and through such additional transistors, to the base electrodes of the pair of transistors of the differential pair. In one embodiment of the invention, the additional transistors are connected in a Darlington pair arrangement with the pair of transistors of the differential pair. While switching transients is the common mode voltage is still present because of the transient base current produced in the pair of transistors of the differential pair, the magnitude of the base current is attenuated by a factor $\beta+1$, where $\beta$ is the beta of the additional (i.e., Darlington pair) of transistors. In another embodiment of the invention, the pair of transistors of the differential pair are NPN transistors and the additional, Darlington connected, pair of transistors are PNP transistors.

20 Claims, 4 Drawing Sheets

DIFFERENTIAL LINE DRIVER

BACKGROUND OF THE INVENTION

This invention relates generally to differential line drivers and more particularly to differential line drivers adapted for use in data networks, such as Asynchronous Transfer Mode (ATM) data networks which require the transmission of high speed digital data over unshielded cable, such as an unshielded twisted pair transmission line.

As is known in the art, many new data networks, such as ATM data networks, require the transmission of high speed digital data over unshielded cable. For example, ATM requires 155 megabit (Mb) per second, two level data to be transported via UTP5 (i.e., category 5, unshielded twisted pair transmission line). Each transceiver in the ATM system typically includes a differential line driver, fed by differential binary data, for driving the unshielded twisted pair transmission line. One transceiver 10 is shown in FIG. 1. Here a differential logic input signal 11 is fed to the IN+, IN− pair of input terminals of a differential pair 12, as shown. The differential pair 12 includes a pair of transistors $Q_A$, $Q_B$ with base electrodes fed by the differential logic input signal 11. The collector electrodes are coupled to a supply voltage, $+V_c$, via resistors R, as shown, and to the twisted pair 13. The emitter electrodes are connected to a current source, I, as shown.

One key requirement is the conformance to electromagnetic interference (EMI) standards. Use of the twisted pair 13 significantly reduces EMI emission of the differential signal produced by the transceiver 10. However, switching transients resulting from changes in the input signal 11 may produce EMI which requires additional suppression. Such additional EMI suppression is sometimes provided by transformer/inductor modules, such as transformer module 14 shown in FIG. 1. Here, the transformer module 14 includes inductors $L_A$, $L_B$, $L_C$, and $L_D$, arranged as shown to provide additional EMI emission suppression. While such transformer/inductor module provides additional EMI suppression, such module is relatively expensive.

SUMMARY OF THE INVENTION

In accordance with the present invention, a differential line driver is provided having a pair of transistors arranged as a differential pair for driving a transmission line with a differential logic output signal produced in accordance with an differential logic input signal fed to the base electrodes of the pair of transistors. The differential line driver includes circuitry for suppressing common mode voltage switching transients produced at the collector electrodes of the pair of transistors in response to changes in the binary level of the differential logic input signal.

With such an arrangement, suppression of the common mode voltage switching transients produced at the collector electrodes reduces EMI emissions and provides a differential line driver which achieves standard compliant EMI emission without requiring a relatively expensive transformer/inductor module.

In accordance with the invention, the common mode voltage switching transient suppression circuitry includes a pair of additional transistors. The differential logic input signal is fed to base electrodes of the additional transistors, and through such additional transistors, to the base electrodes of the pair of transistors of the differential pair.

In one embodiment of the invention, the additional transistors are connected in a Darlington pair arrangement with the pair of transistors of the differential pair. With such an arrangement, while switching transients in the common mode voltage are still present because of switching transient base currents produced in the pair of transistors of the differential pair, the magnitude of the base current is attenuated by a factor $\beta+1$, where $\beta$ is the beta of the additional (i.e., Darlington connected) pair of transistors. Because the $\beta$ of the additional transistors has an effective value during switching of about 9, common mode voltage switching transients at the collectors of the pair of transistors of the differential pair are reduced by an order of magnitude thereby significantly reducing EMI emissions.

In another embodiment of the invention, the pair of transistors of the differential pair are NPN transistors and the additional, Darlington connected, pair of transistors are PNP transistors. Such arrangement maintains the supply voltage requirements used for the differential pair 12 in FIG. 1. Additional current sources are provided to bias the additional, Darlington connected, pair of transistors.

BRIEF DESCRIPTION OF THE DRAWINGS

These and other features of the invention, as well as the invention itself, will become more readily apparent with reference to the following description taken together with the following drawings, in which.

DESCRIPTION OF THE PREFERRED EMBODIMENTS

Figure 2:
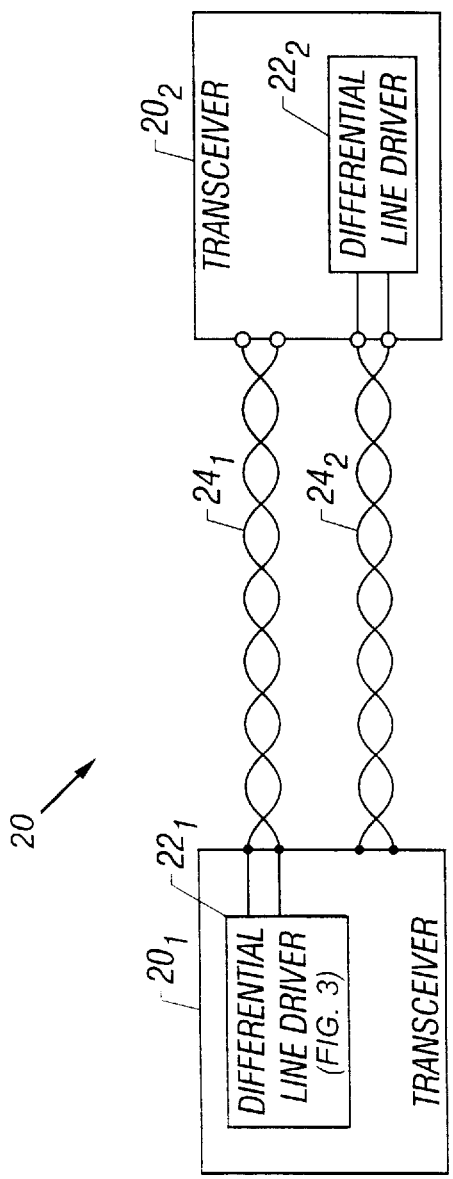
FIG. 2 is a block diagram of a data network in accordance with the present invention.
Figure 3:
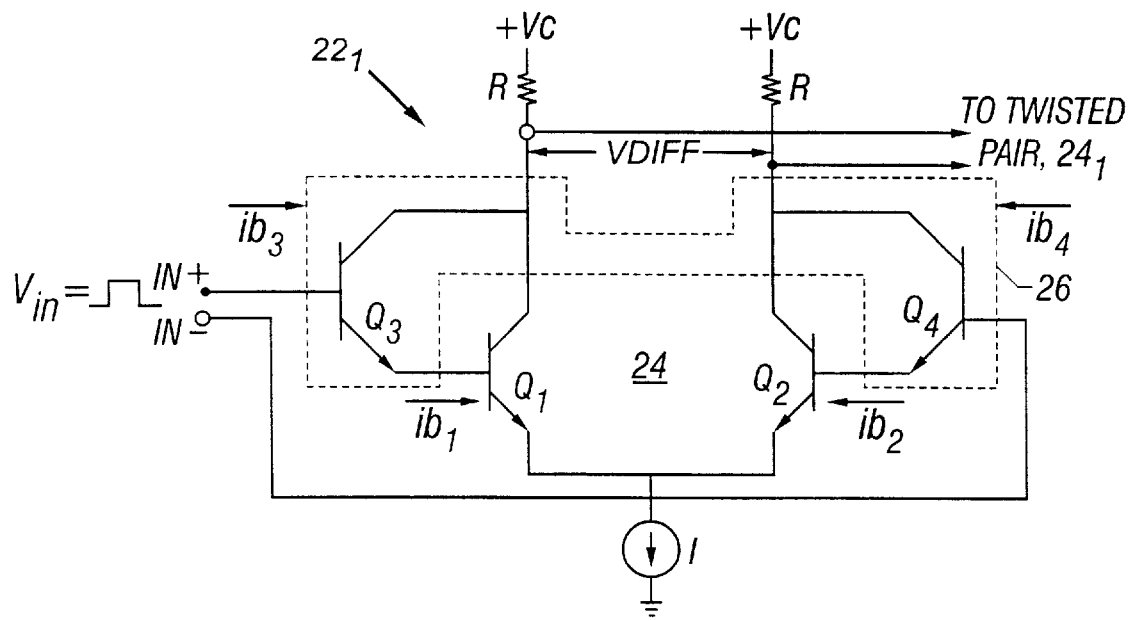
FIG. 3 is a simplified schematic diagram of a differential line driver adapted for use in the data network of FIG. 2 in accordance with one embodiment of the invention.

Referring now to FIG. 2, a data network 20, here an Asynchronous Transfer Mode (ATM) data network, is shown, The network 20 includes a pair of transceivers $20_1$, $20_2$ coupled together through unshielded cables, here a unshielded twisted pair transmission lines $24_1$, $24_2$, as shown. The transceivers are configured to transmit and receive data at a 155 megabit (Mb) per second rate. Each one of the transceivers includes a differential line driver $22_1$, $22_2$. Each one of the differential line drivers $22_1$, $22_2$ is identical in construction, an exemplary one thereof, here differential line driver $22_1$, being shown in detail in FIG. 3.

The differential line driver $22_1$, includes: (a) a pair of transistors $Q_1$, $Q_2$ arranged as a differential pair 24 for driving a transmission line, here the unshielded twisted pair transmission line $24_1$, (FIG. 2), with a differential logic output signal produced in accordance with a differential logic input signal, VIN, fed to the base electrodes of the pair of transistors $Q_1$, $Q_2$ via input terminals IN+, IN−, respectively; and, (b) EMI suppression circuitry 26 for suppressing common mode voltage switching transients produced at the collector electrodes of the pair of transistors $Q_1$, $Q_2$ of the differential pair 24 in response to changes in the binary, or logic, level of the differential logic input signal, VIN.

More particularly, the EMI suppression circuitry 26 includes a pair of additional transistors $Q_3$, $Q_4$. The differential logic input signal VIN is fed to base electrodes of the additional transistors $Q_3$, $Q_4$ and through such additional transistors $Q_3$, $Q_4$ to the base electrodes of the pair of transistors $Q_1$, $Q_2$ of the differential pair 24, as shown. The additional transistors $Q_3$, $Q_4$ are connected in a Darlington pair arrangement with the pair of transistors $Q_1$, $Q_2$ of the differential pair 24. Here, the transistors $Q_1$ through $Q_4$ are the same type bipolar transistors (i.e., NPN transistors). With such an arrangement, while switching transients in the common mode voltage is still present because of the transient base current ib1, ib2 produced in the pair of transistors $Q_1$, $Q_2$, respectively, of the differential pair 24, the magnitude of the base current ib1, ib2 is attenuated by a factor $\beta+1$, where $\beta$ is the beta of the additional (i.e., Darlington connected) pair of transistors $Q_3$, $Q_4$. Because $\beta$ of the additional transistors $Q_3$, $Q_4$ has an effective value during switching of about 9, common mode voltage switching transients at the collectors of the pair of transistors $Q_1$, $Q_2$ of the differential pair 24 are reduced by an order of magnitude and thereby significantly reduce EMI emissions.

More particularly, referring again to FIG. 1, and assuming that the equivalent impedance of the twisted pair 13 is 2R, if the base currents ibA, ibB, of transistors $Q_A$, $Q_B$, respectively, are zero:

(a) the peak-to-peak differential output voltage, Vdiff= I×R; and, (b) the common mode voltage, Vcm=I×(R/2).

If, the base currents are time dependent and non-zero, as during switching of the transistors $Q_A$, $Q_B$, in response to changes in the binary level of the differential logic input signal 11:

(a) Vdiff=((I−ibA)×R+(I−ibB)×R)/2, or Vdiff=I×R−(ibB+ibA)×R/2; and, (b) Vcm=I×R/2−(ibB+ibA)×R/2.

Note that even if $Q_A$ and $Q_B$ are identical, matched, transistors, ibA will not equal ibB during the switching transient. Thus, Vcm consists of a DC component, $Vcm_{dc}$= (I×R/2), and an AC component, $Vcm_{ac}$=(ibB+ibA)×R/2. The EMI emission is caused by the AC component of Vcm, i.e., $Vcm_{ac}$.

Figure 1:
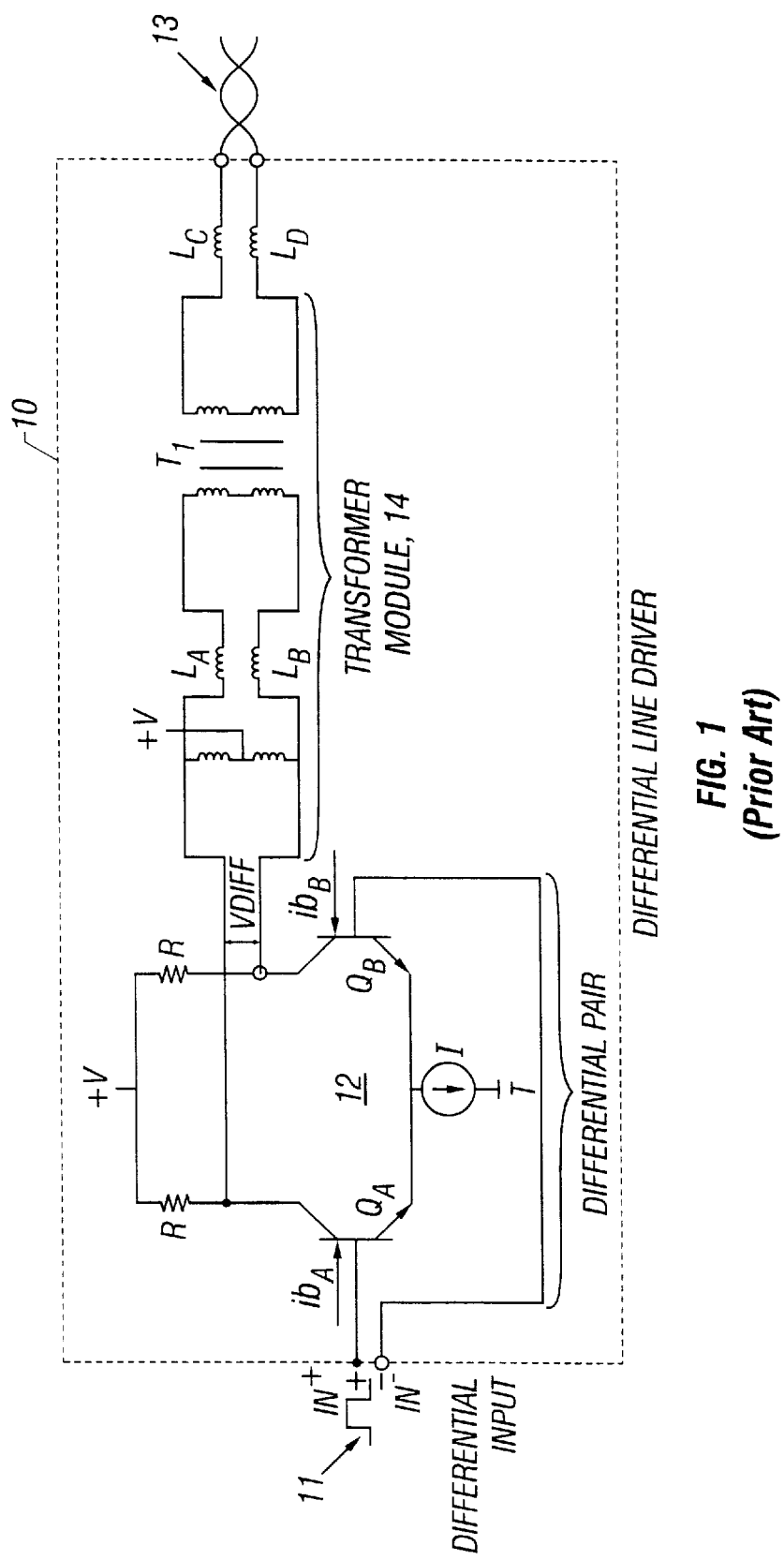
FIG. 1 is a block diagram of a differential line driver in accordance with the PRIOR ART.

More particularly, referring to the differential pair 12 of FIG. 1, because during switching the base current ibA of transistor $Q_A$ will not be equal to the base current ibB of transistor $Q_B$ (even if transistors $Q_A$ is identical (i.e., matched) to transistor $Q_B$), an AC, or high frequency common mode voltage switching transient component $Vcm_{ac}$= (ibA+ibB)×(R/2) component will be produced in addition to the dc common mode voltage component $Vcm_{dc}$(I×(R/2)); where the total common mode voltage, $Vcm=V_{dc}-Vcm_{ac}$. Also, the peak-to-peak differential output voltage, Vdiff, between the collector electrode of transistors $Q_A$, $Q_B$ voltage will be produced equal to: ((I−ibA)×R+(I−ibB)×R)/2. Or, re-written: Vdiff=I×R−(ibB+ibA)×(R/2). Further, from above, Vcm=I×(R/2)−(ibB+ibA)×(R/2).

Thus, assuming: R=50 ohms; the current source I (coupled to the emitters of the transistors $Q_A$, $Q_B$)=20 milliamps; and, ibA+ibB=800 µamps peak-to-peak during a data transition, (i.e., input signal, VIN, transition or binary level change), then: the differential voltage, Vdiff=I×R− (ibA+ibB)×(R/2)=0.98 peak-to-peak differential voltage; and, $Vcm_{ac}$=(ibB+ibA)×(R/2)=0.02 peak-to-peak common mode voltage. Therefore, $Vcm_{ac}$ is 2% of the differential voltage, Vdiff (i.e., $Vcm_{ac}$=[100%×(0.02/0.98)]Vdiff]).

Considering now the differential line driver $22_1$, (FIG. 3), the Vdiff (i.e, the voltage difference between the collector electrodes of transistors $Q_1$, and $Q_2$), Vdiff=I×R−(ib4+ib3) ×(R/2) and ac common mode voltage switching transient, $Vcm_{ac}$=I×(R/2)−(ib4+ib3)×(R/2), where ib4 is the base current in transistor $Q_4$ and ib3 is the base current in transistor $Q_3$. It is noted that now $Vcm_{ac}$ is dependent on (ib4+ib3) peak-to-peak current deviation during input signal VIN binary level changes (i.e., during switching). Switching current (ib2+ib1) is still present, but is divided by ($\beta$+1), where $\beta$ is the beta of transistor $Q_3$ and of transistor $Q_4$ to produce (ib4+ib3).

Therefore, consider again the case where: R=50 ohms; I=20 milliamps; and (ib2+ib1)=800 µamps peak-to-peak current deviation during a data transition (i.e., input signal VIN binary level change). Additionally, assume an effective $\beta$ during switching of 9. Therefore, ib4+ib3=80 µamps peak-to-peak. Also: (a) Vdiff=I×R−(ib4+ib3)×(R/2)=0.988 peak-to-peak differential voltage; and, (b) $Vcm_{ac}$=(ib4+ib3) ×(R/2)=0.002 peak-to-peak common mode voltage. Therefore, $Vcm_{ac}$=0.2% of the differential voltage, Vdiff (i.e., $Vcm_{dc}$=[100%×(0.002/0.998)]Vdiff).

It should be noted that the supply voltage $V_c$ of the differential line driver $22_1$, (FIG. 3) is one Vbe (i.e., base to emitter voltage) higher than that required for the differential line driver 10 in FIG. 1. Further, additional current sources, not shown, coupled to the emitter electrodes of transistors $Q_3$, $Q_4$ are necessary to bias transistors $Q_3$, $Q_4$.

Figure 4:
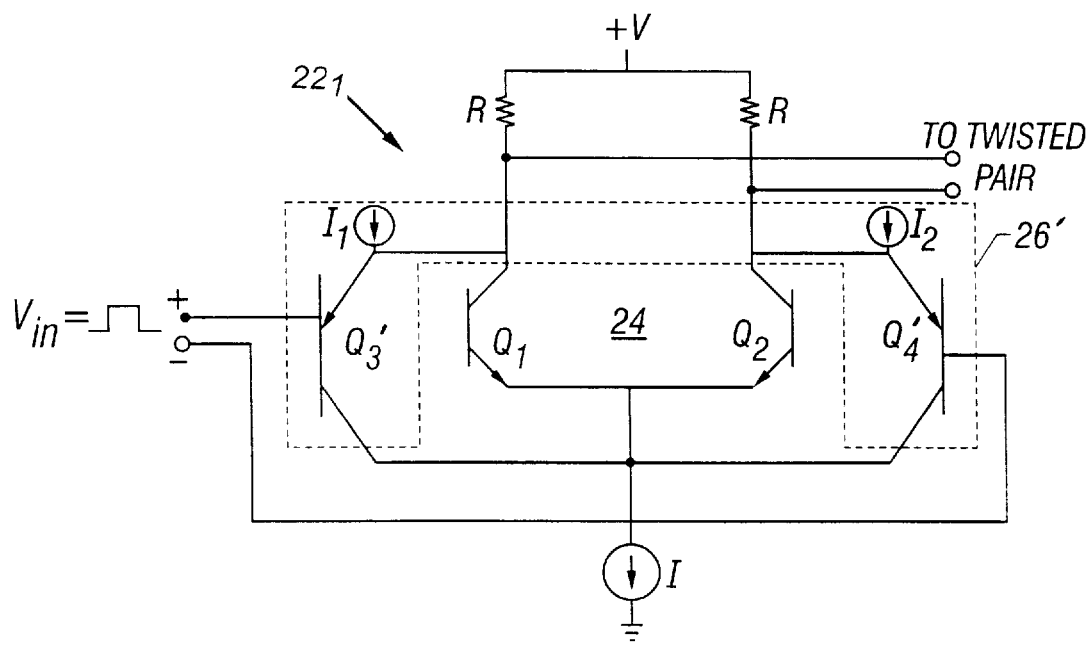
FIG. 4 is a simplified schematic diagram of a differential line driver adapted for use in the data network of FIG. 2 in accordance with another embodiment of the invention.

Referring now to FIG. 4, an alternative differential line driver $22'_1$ is shown to include, EMI suppression circuitry 26' for suppressing common mode voltage switching transients produced at the collector electrodes of the pair of transistors $Q_1$, $Q_2$ of the differential pair 24 in response to changes in the binary level of the differential logic input signal, VIN. More particularly, the EMI suppression circuitry 26' includes the pair of additional transistors $Q'_3$, $Q'_4$. The differential logic input signal VIN is fed to base electrodes of the additional transistors $Q'_3$, $Q'_4$ and through such additional transistors $Q_3$, $Q_4$ to the base electrodes of the pair of transistors $Q_1$, $Q_2$ Of the differential pair 24, as shown. Here, the additional transistors of circuitry 26' are PNP transistors $Q'_3$, $Q'_4$ Thus, here again, the differential logic input signal VIN is fed to base electrodes of the additional transistors $Q'_3$, $Q'_4$ and through such additional transistors $Q'_3$, $Q'_4$ to the base electrodes of the pair of transistors $Q_1$, $Q_2$ of the differential pair 24, as shown. The additional transistors $Q'_3$, $Q'_4$ are connected in a Darlington pair arrangement with the pair of transistors $Q_1$, $Q_2$ of the differential pair 24. Here, the transistors $Q'_3$ and $Q'_4$ are of a type of bipolar transistor different from the type of bipolar transistors of the differential pair 24 transistors $Q_1$, $Q_2$ (i.e., transistors $Q_1$, $Q_2$ are NPN transistors and transistors $Q'_3$, $Q'_4$ are PNP transistors). Here the additional current sources $I_1$, and $I_2$ are shown for supplying bias current to the emitter electrodes of transistors $Q'_3$ and $Q'_4$. With such an arrangement, the differential line driver $22'_1$ of FIG. 4 reduces the common mode voltage switching transients while keeping supply voltage, $V_c$, requirements the same as for differential line driver 10, FIG. 1. With differential line driver $22'_1$ (FIG. 4), $Vcm_{ac}$=(ib4+ib3)×(R/2). Here again, as in FIG. 3, switching current (ib2+ib1) is divided by ($\beta$+1) to produce (ib4+ib3). For the same assumptions above, (i.e., R=50 ohms; I=20 milliamps; and (ib2+ib1)=800 µamps peak-to-peak during an input signal VIN), $Vcm_{ac}$ will equal 0.02% of the differential voltage, Vdiff.

Figure 5:
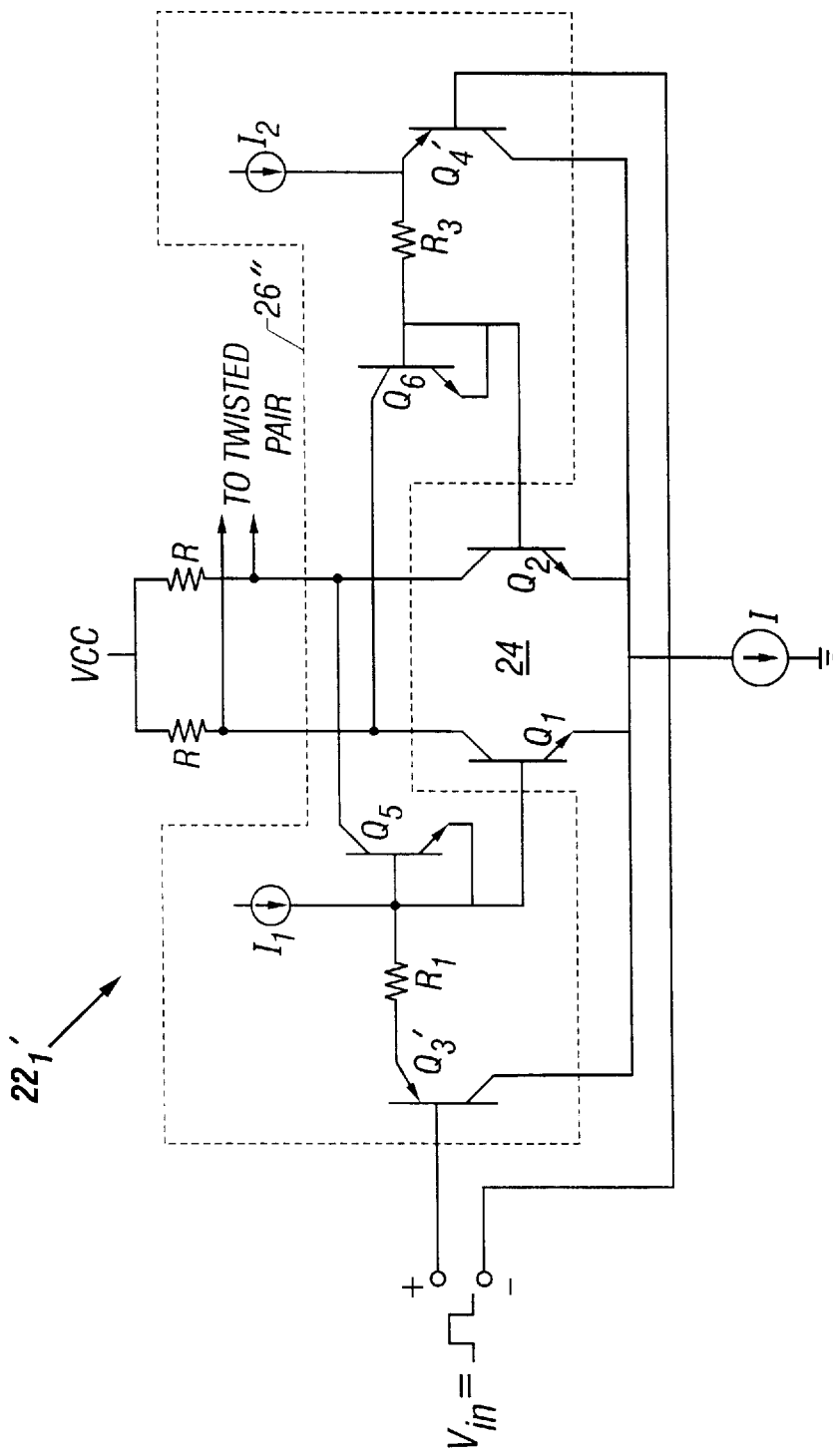
FIG. 5 is a more detailed schematic diagram of the differential line driver of FIG. 4 in accordance with the invention.

Referring now to FIG. 5, a more detailed schematic diagram of the differential line driver $22'_1$ (FIG. 4) is shown, to include diode connected transistors $Q_5$, $Q_6$. Transistor $Q_5$ has its base electrode coupled to its emitter electrode and to the collector electrode of transistor $Q'_3$ via a resistor $R_1$ and to the base electrode of transistor $Q_1$. The collector electrode of transistor $Q_5$ is connected to the collector electrode of transistor $Q_2$. Similarly, transistor $Q_6$ has its base electrode coupled to its emitter electrode and to the collector electrode of transistor $Q'_4$ via a resistor $R_3$ and to the base electrode of transistor $Q_2$. The collector electrode of transistor $Q_6$ is connected to the collector electrode of transistor $Q_1$. The diode connected transistors $Q_5$, $Q_6$ reduce the effect of any dynamic variations at the collectors of transistors $Q_1$, $Q_2$. The resistors $R_1$ and $R_3$ are provided for damping, i.e., stability, in the loop from: (a) the emitter of transistor $Q_1$, the base of transistor $Q_1$, the resistor $R_1$, and the emitter-collector of transistor $Q'_3$; (b) the emitter of transistor $Q_2$, the base of transistor $Q_2$, the resistor $R_3$, and the emitter-collector of transistor $Q'_4$.

Here again, the differential line driver $22'_1$ (FIG. 5) includes circuitry 26" for suppressing common mode voltage switching transients produced at the collector electrodes of the pair of transistors $Q_1$, $Q_2$ of the differential pair 24 in response to changes in the binary level of the differential logic input signal, VIN. More particularly, the EMI suppression circuitry 26" includes the pair of additional transistors $Q'_3$, $Q'_4$. The differential logic input signal VIN is fed to base electrodes of the additional transistors $Q'_3$, $Q'_4$ and through such additional transistors $Q_3$, $Q_4$ to the base electrodes of the pair of transistors $Q_1$, $Q_2$ of the differential pair 24, as shown. Here, the additional transistors of circuitry 26" are PNP transistors $Q'_3$, $Q'_4$. The additional transistors $Q'_3$, $Q'_4$ are connected in a Darlington pair arrangement with the pair of transistors $Q_1$, $Q_2$ of the differential pair 24. Here, the transistors $Q'_3$ and $Q'_4$ are of a type of bipolar transistor different from the type of bipolar transistors of the differential pair 24 transistors $Q_1$, $Q_2$ (i.e., transistors $Q_1$, $Q_2$ are NPN transistors and transistors $Q'_3$, $Q'_4$ are PNP transistors). Here the additional current sources $I_1$ and $I_2$ are shown for supplying bias current to the emitter electrodes of transistors $Q'_3$ and $Q'_4$. With such an arrangement, the line driver $22'_1$ of FIG. 4 reduces the common mode voltage switching transients while keeping supply voltage, $V_c$, requirements the same as for differential line driver 10, FIG. 1.

Other embodiments are within the spirit and scope of the appended claims.

What is claimed is:

1. A data network, comprising:
   (A) an unshielded transmission line;
   (B) a pair of transceivers coupled together through the transmission line, each one of such transceivers comprising:
      a differential line driver for feeding a differential logic output signal to the transmission line, such differential line driver comprising:
         (i) a pair of transistors arranged as a differential pair for driving the transmission line with the differential logic output signal produced in accordance with an differential logic input signal fed to base electrodes of the pair of transistors; and,
         (ii) circuitry for suppressing EMI emissions generated by common mode voltage switching transients produced at collector electrodes of the pair of transistors in response to changes in the differential logic input signal.

2. A data network, comprising:
   (A) an unshielded transmission line;
   (B) a pair of transceivers coupled together through the transmission line, each one of such transceivers comprising:
      a differential line driver for feeding a differential logic output signal to the transmission line, such differential line driver comprising:
         (i) a pair of transistors arranged as a differential pair for driving the transmission line with the differential logic output signal produced in accordance with an differential logic input signal fed to base electrodes of the pair of transistors; and,
         (ii) circuitry for suppressing EMI emissions generated by common mode voltage switching transients produced at collector electrodes of the pair of transistors in response to changes in the differential logic input signal; and
      wherein the EMI emission suppression circuitry includes:
         a pair of additional transistors; and
         wherein the differential logic input signal is fed to base electrodes of the additional transistors, and through such additional transistors, to the base electrodes of the pair of transistors of the differential pair.

3. The network recited in claim 2 wherein the additional transistors are connected in a Darlington pair arrangement with the pair of transistors of the differential pair.

4. The network recited in claim 3 wherein the pair of transistors of the differential pair are NPN transistors and the additional pair of transistors are PNP transistors.

5. The network recited in claim 4 including current sources coupled to bias the additional pair of transistors.

6. The network recited in claim 5 wherein the transmission line is a twisted pair transmission line.

7. The network recited in claim 6 wherein such network is an Asynchronous Transfer Mode (ATM) data network.

8. The network recited in claim 7 wherein the transceivers are configured to transmit and receive data at a 155 megabit (Mb) per second rate.

9. A data network wherein a pair of transceivers are coupled together through a transmission line, each one of such transceivers including a differential line driver for feeding a differential logic output signal to the transmission line, such differential line driver comprising:
   a pair of transistors arranged as a differential pair for driving the transmission line with the differential logic output signal produced in accordance with an differential logic input signal fed to base electrodes of the pair of transistors;
   circuitry for suppressing common mode voltage switching transients produced at collector electrodes of the pair of transistors in response to changes in the differential logic input signal.

10. A data network wherein a pair of transceivers are coupled together through a transmission line, each one of such transceivers including a differential line driver for feeding a differential logic output signal to the transmission line, such differential line driver comprising:
   a pair of transistors arranged as a differential pair for driving the transmission line with the differential logic output signal produced in accordance with an differential logic input signal fed to base electrodes of the pair of transistors;
   circuitry for suppressing common mode voltage switching transients produced at collector electrodes of the pair of transistors in response to changes in the differential logic input signal; and
   wherein the common mode voltage switching transient suppression circuitry includes:
      a pair of additional transistors; and
      wherein the differential logic input signal is fed to base electrodes of the additional transistors, and through such additional transistors, to the base electrodes of the pair of transistors of the differential pair.

11. The network recited in claim 10 wherein the additional transistors are connected in a Darlington pair arrangement with the pair of transistors of the differential pair.

12. The network recited in claim 11 wherein the pair of transistors of the differential pair are NPN transistors and the additional pair of transistors are PNP transistors.

13. The network recited in claim 12 including current sources coupled to bias the additional pair of transistors.

14. A differential line driver, comprising:
- a pair of transistors arranged as a differential pair for driving a transmission line with a differential logic output signal produced in accordance with a differential logic input signal fed to base electrodes of the pair of transistors;
- circuitry for suppressing common mode voltage switching transients produced at collector electrodes of the pair of transistors in response to changes in the differential logic input signal.

15. A differential line driver, comprising:
- a pair of transistors arranged as a differential pair for driving a transmission line with a differential logic output signal produced in accordance with a differential logic input signal fed to base electrodes of the pair of transistors;
- circuitry for suppressing common mode voltage switching transients produced at collector electrodes of the pair of transistors in response to changes in the differential logic input signal; and
- wherein the common mode voltage switching transient suppression circuitry includes:
  - a pair of additional transistors; and
  - wherein the differential logic input signal is fed to base electrodes of the additional transistors, and through such additional transistors, to the base electrodes of the pair of transistors of the differential pair.

16. The line driver recited in claim 15 wherein the additional transistors are connected in a Darlington pair arrangement with the pair of transistors of the differential pair.

17. The differential line driver recited in claim 16 wherein the pair of transistors of the differential pair are NPN transistors and the additional pair of transistors are PNP transistors.

18. The differential line driver recited in claim 17 including current sources coupled to bias the additional pair of transistors.

19. A differential line driver, comprising:
- a first pair of bipolar transistors arranged as a differential pair;
- a second pair of bipolar transistors, one of the first and second pair of transistors being NPN transistors and the other one of the pair of transistors being PNP transistors;
- wherein base electrodes of the second pair of transistors are adapted for coupling to an input logic signal, emitter electrodes of the second pair of transistors being coupled to base electrodes of the first pair of transistors and collector electrodes of both transistors in the second pair of transistors being coupled to both emitters of the first pair of transistors.

20. The differential line driver recited in claim 19 including: a first resistor coupled between the emitter of a first one of the transistors in the second pair of transistors and the base electrode of the one of the transistors in the first pair of transistors coupled thereto.

* * * * *